(12) United States Patent
Forbes et al.

(10) Patent No.: US 7,164,168 B2
(45) Date of Patent: Jan. 16, 2007

(54) NON-PLANAR FLASH MEMORY HAVING SHIELDING BETWEEN FLOATING GATES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 239 days.

(21) Appl. No.: 10/910,191

(22) Filed: Aug. 3, 2004

(65) Prior Publication Data

US 2006/0028867 A1 Feb. 9, 2006

(51) Int. Cl.
*H01L 29/788* (2006.01)

(52) U.S. Cl. ...................... 257/315; 257/316

(58) Field of Classification Search ........... 257/315, 257/316
See application file for complete search history.

(56) References Cited

U.S. PATENT DOCUMENTS

| 5,502,321 | A | * | 3/1996 | Matsushita ............... 257/316 |
| 5,867,429 | A | | 2/1999 | Chen |
| 5,936,274 | A | * | 8/1999 | Forbes et al. ............. 257/315 |
| 5,981,341 | A | | 11/1999 | Kim |
| 6,281,075 | B1 | | 8/2001 | Yuan |
| 6,458,658 | B1 | | 10/2002 | Yuan |
| 2004/0012998 | A1 | | 1/2004 | Chien |
| 2005/0157549 | A1 | * | 7/2005 | Mokhlesi et al. ...... 365/185.01 |

OTHER PUBLICATIONS

P. Paven, et al., "Flash Memory Cells-An Overview," Proc. IEEE, vol. 85, No. 8, Aug. 1997, pp. 1248-1271.

D.-C. Kim et al., "A 2Gb NAND Flash Memory with 0.044 μm Cell Size using 90nm Flash Technology," IEEE IEDM, San Francisco, 2002, pp. 919-922.

J.-D. Choi et al., "Highly Manufacturable 1 Gb NAND Using 0.12 μm Process Technology," IEEE IDEM, Washington, D.C., 2001, pp. 25-28.

J.-D. Lee, S.-H. Hur, and J.-D. Choi, "Effects of Floating-Gate Interference on NAND Flash Memory Cell Operation," IEEE Electron Device Letters, vol. 23, No. 5, May 2002, pp. 264-266.

J. Plummer, "Silicon VLSI Technology, Fundamentals, Practice and Modeling," Prentice Hall, Upple Saddle River, N.J., © 2000, pp. 539-554.

G. Xue, et al., "Low Voltage Low Cost Nitride Embedded Flash Memory Cell,"IMEC, Kapeldreef 75, B3001 Leuven Belgium, 19th IEEE Non-Volatile Semiconductor Memory Workshop, Monterey, CA, Feb. 16, 2003, pp. 62-64.

* cited by examiner

*Primary Examiner*—Richard Elms
*Assistant Examiner*—Allison Bernstein
(74) *Attorney, Agent, or Firm*—Leffert Jay & Polglaze P.A.

(57) ABSTRACT

A first plurality of memory cells is formed on pillars in a first column of the array. A second plurality of memory cells is formed in a first set of trenches in the same column. The second plurality of memory cells is coupled to the first plurality of memory cells through a series connection of their source/drain regions. A second set of trenches, perpendicular to the first set, is formed to separate columns of the array. Wordlines are formed along rows of the array. The wordlines are formed into the second set of trenches in order to shield adjacent floating gates. Metal shields are formed in the first set of trenches along the rows and between floating gates on the pillars.

21 Claims, 5 Drawing Sheets

US 7,164,168 B2

NON-PLANAR FLASH MEMORY HAVING SHIELDING BETWEEN FLOATING GATES

TECHNICAL FIELD OF THE INVENTION

The present invention relates generally to memory devices and in particular the present invention relates to a flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Stray capacitance in flash memory cells can cause problems. For example, the capacitance between different floating gates that are close together can cause coupling and cross-talk between the floating gates of neighboring cells. This may also have the effect of reducing memory cell performance.

FIG. 1 illustrates a cross-sectional view of a typical prior art memory cell array. A typical cell is comprised of a silicon substrate 100. A gate insulator layer 101 is formed on top of the substrate 100. Oxide isolation areas 103 and 104 are formed between the cells. The floating gates 105 and 106 are formed between the oxide isolation areas 103 and 104. An interpoly insulator 107 is formed over the floating gates 105 and 106 prior to forming the control gate 110 on top. The memory array is comprised of multiple rows 120 and 121 of memory cell transistors.

The capacitances that couple the various components of the array are illustrated as $C_{A-D}$. $C_A$ is the row-to-row floating gate stray capacitance. $C_B$ is the end-to-end floating gate stray capacitance. $C_C$ is the floating gate-to-control gate coupling capacitance and $C_D$ is the floating gate-to-substrate coupling capacitance.

The ratio of these capacitive components is determined by the geometrical dimensions of the facing surfaces constituting the capacitance and the dielectric constants of the insulator materials. The ends and sides of the floating gates are the plate areas of the stray capacitances. The dielectrics between the side and end areas are the oxide and have the same dielectric constant as the gate oxide. In the case of NAND flash memory devices, the polysilicon floating gate material is thick resulting in large surfaces on the ends and sides of the floating gates. The thick floating gate material results in greater stray capacitances.

For the reasons stated above, and for other reasons stated below which will become apparent to those skilled in the art upon reading and understanding the present specification, there is a need in the art for a flash memory cell transistor that has reduced coupling between floating gates.

SUMMARY

The above-mentioned problems with flash memories and other problems are addressed by the present invention and will be understood by reading and studying the following specification.

The present invention encompasses a non-planar flash memory array with shielded floating gates. Each memory cell has a floating gate and a control gate coupled to a wordline. A first set of memory cells is formed on pillars in a first column of memory cells. A second set of memory cells is formed in a first set of trenches that define the pillars. A second set of trenches, perpendicular to the first set, separate the columns of memory cells. A metal shield is formed along the rows in the first set of trenches so that the floating gates of the memory cells on the pillars are shielded from adjacent floating gates on pillars. The wordlines are formed along the rows and down into the second set of trenches to shield the floating gates along the rows from adjacent floating gates across the second set of trenches.

Further embodiments of the invention include methods and apparatus of varying scope.

DETAILED DESCRIPTION

Figure 1:
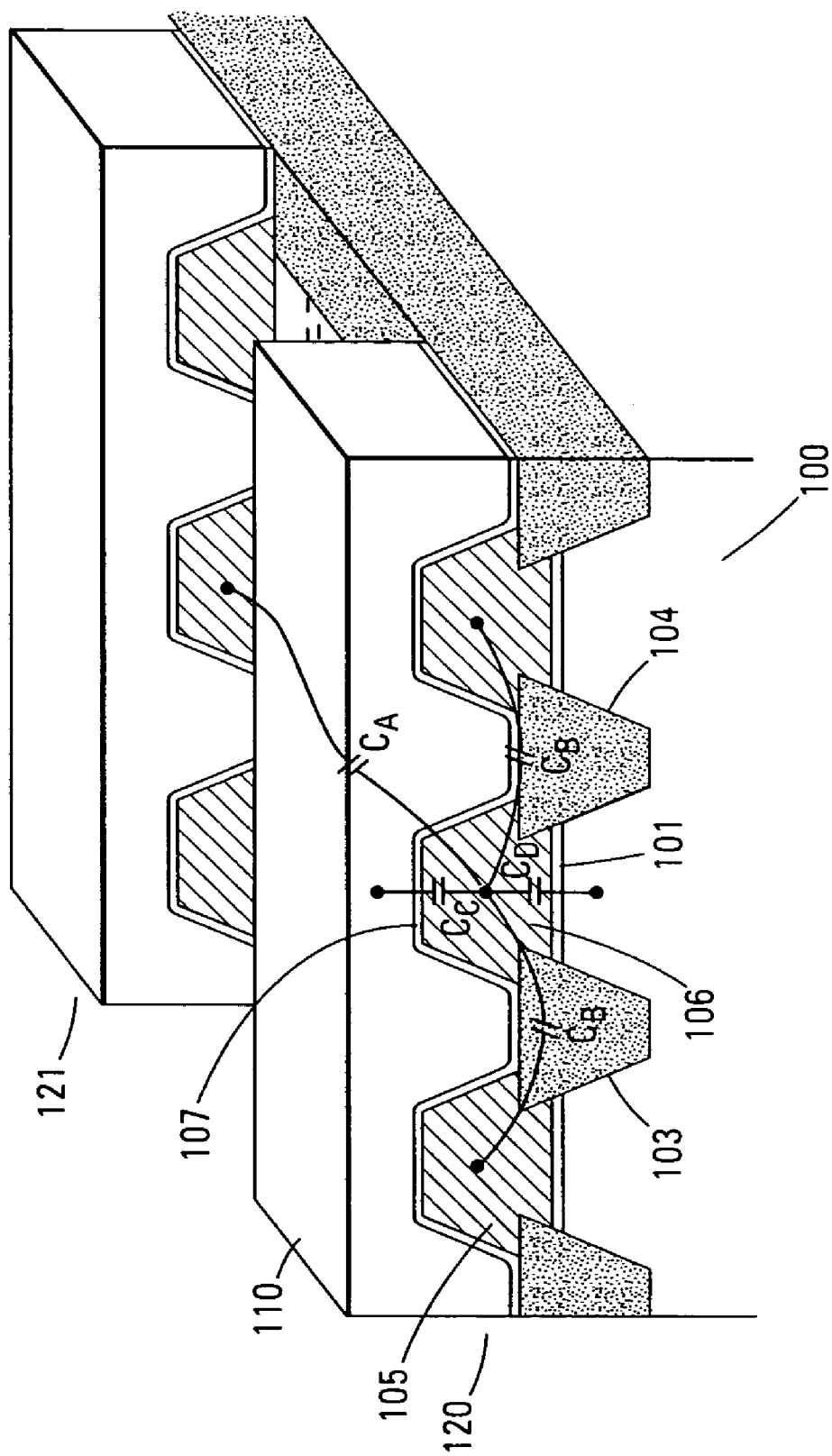
FIG. 1 shows a cross-sectional view, along a wordline, of a typical prior art NAND flash memory cell array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

While the subsequently described embodiments are to a NAND flash memory device, the present invention is not limited to such an architecture. For example, using a virtual ground array that is well known in the art, the flash memory array with shielded floating gates can be fabricated in a NOR architecture.

In the NOR configuration, the cells are arranged in a matrix. The gates of each floating gate memory cell of the array matrix are connected by rows to wordlines and their drains are connected to column bitlines. The source of each floating gate memory cell is typically connected to a common source line. Still other embodiments can use other architectures.

Figure 2:
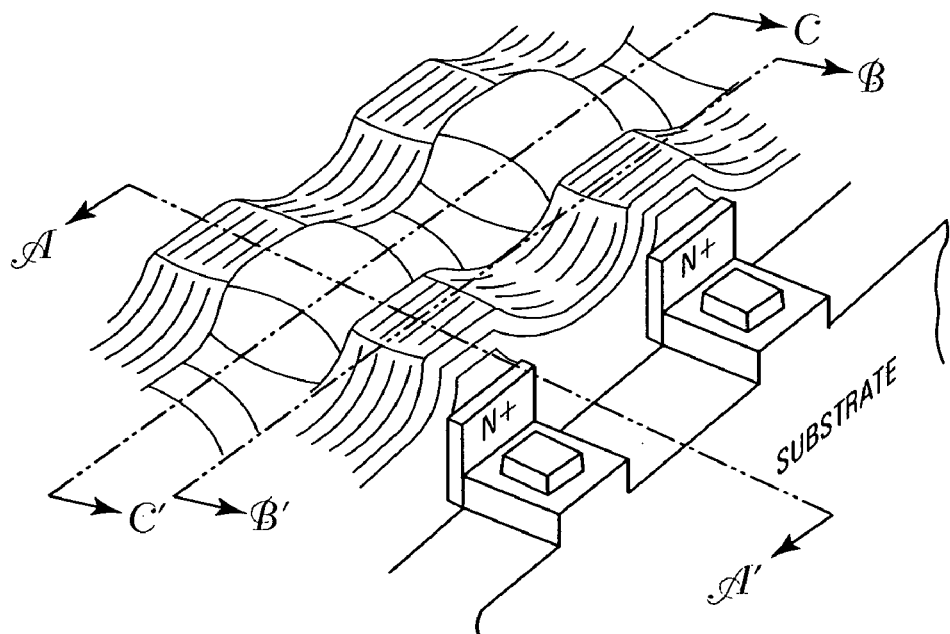
FIG. 2 shows a perspective view of one embodiment of a flash memory array of the present invention with shielded floating gates.

FIG. 2 illustrates a perspective view of one embodiment of a flash memory device of the present invention with shielded floating gates. Due to its non-planar structure, some of the floating gates are on pillars of silicon while other floating gates are in trenches between the pillars. Metal shielding prevents coupling between floating gates on the same plane in the same column. The pillars shield the floating gates that are in the trenches and in the same column. Deep trenches separate the columns. Wordlines are formed into the deep trenches between columns to prevent coupling between floating gates in adjacent columns and on the same plane.

Figure 3:
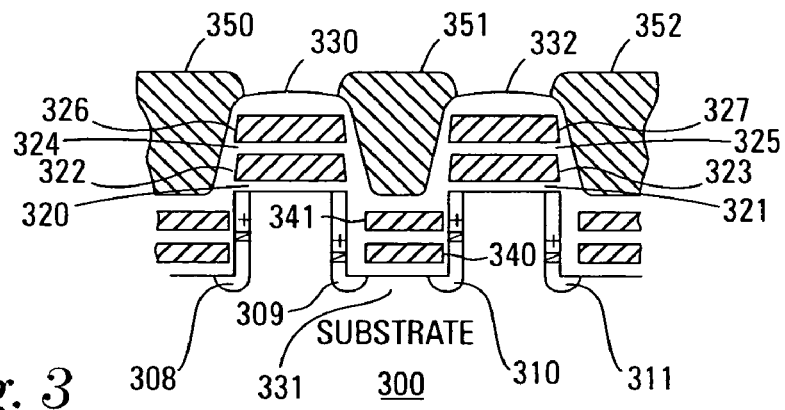
FIG. 3 shows a cross-sectional view along axis A–A' of the embodiment of FIG. 2.
Figure 4:
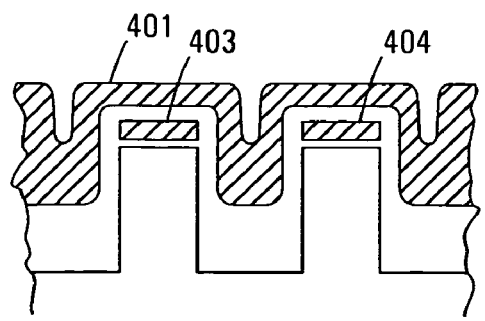
FIG. 4 shows a cross-sectional view along axis B–B' of the embodiment of FIG. 2.
Figure 5:
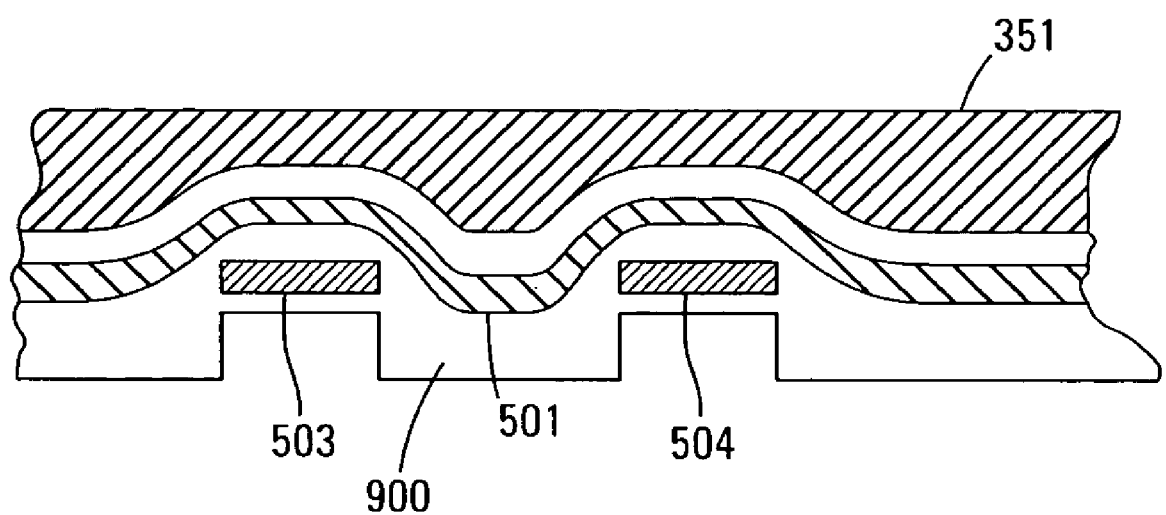
FIG. 5 shows a cross-sectional view along axis C–C' of the embodiment of FIG. 2.

FIG. 2 illustrates cross-sectional axes that are used to show the structures of the present invention. A cross-sectional view along axis A–A' of one embodiment of the present invention is illustrated in FIG. 3. A cross-sectional view along axis B–B' of one embodiment of the present invention is illustrated in FIG. 4. Similarly, a cross-sectional view along axis C–C' of one embodiment of the present invention is illustrated in FIG. 5.

FIG. 3 illustrates a cross-sectional view along axis A–A' of the embodiment of FIG. 2. The memory cells are fabricated on a trenched surface with steps between the adjacent devices along the row of series connected cells. The cells are not vertical structures but are conventional devices with conduction in channels that are parallel to the substrate surface. These devices achieve a density of $2F^2$/bit with single level storage.

A portion of the array illustrated in FIG. 3 is comprised of a row of cells of which three 330–332 are discussed. Two cells 330 and 332 are fabricated on pillars on the substrate 300. These cells are in the upper plane of the substrate. One cell 331 is in a trench formed by the pillars. This cell 331 is in the lower plane of the substrate.

Source/drain regions 308–311 are doped into the pillars. These regions 308–311 couple adjacent cells (e.g., cell 330 to 331, cell 331 to 332) of each plane together into columns of a NAND architecture. A channel region exists at the top of each pillar such that, during operation of the cells 330 and 332, a channel forms in the channel region between each pair of source/drain regions 308 and 309 or 310 and 311.

In one embodiment, the source/drain regions 308–311 are n+ regions that are doped into a p-type substrate. However, the source/drain regions and substrate of the present invention are not limited to any one conductivity type.

Gate insulator layers 320 and 321 are formed over the channel regions. Floating gates 322 and 323 are formed over the gate insulators 320 and 321 and intergate insulator layers 324 and 325 are formed over these layers 322 and 323. Control gates 326 and 327 are formed over the intergate insulators 324 and 325. The control gates are coupled to the wordlines of the memory array as illustrated in subsequent figures showing different cross-sectional areas.

The lower plane cell 331 is formed in a trench of the substrate 300. The walls of the trench contain the source/drain regions 309 and 310 for this device 331. A channel region for the cell 331 exists at the bottom of the trench between the two source/drain regions 309 and 310. A floating gate 340 and control gate/wordline 341 layers are formed over their respective gate insulator and intergate insulator in the trench. The floating gates 340 of the cells in the same row in the lower plane are shielded from neighboring floating gates in the same row and lower plane by the silicon pillars.

The cells of each row in the upper plane are coupled together through the same wordline. Similarly, each row of the lower plane of cells is coupled along the same wordline.

For shielding purposes, a metal layer 350–352 is formed in the trenches between each upper plane cell 330 and 332. This metal 350–352 shields the floating gates of the adjacent upper plane cells 330 and 332. The metal shields can be formed by oxidation of the wordlines or a process for deposition of metals may be used.

The gate insulator and intergate insulator between the polysilicon gates, as illustrated in FIG. 3, can be high-k dielectrics (i.e., dielectric constant greater than that of $SiO_2$), composite insulators, silicon oxide, or some other insulator. Silicon dioxide ($SiO_2$) is an insulator with a relative dielectric constant of 3.9. A high-k gate insulator requires smaller write and erase voltages due to the reduced thickness layer between the control gate and the floating gate. These dielectric layers may be formed by atomic layer deposition (ALD), evaporation, or some other fabrication technique.

As is well known in the art, ALD is based on the sequential deposition of individual monolayers or fractions of a monolayer in a well-controlled manner. Gaseous precursors are introduced one at a time to the substrate surface and between the pulses the reactor is purged with an inert gas or evacuated.

In the first reaction step, the precursor is saturatively chemisorbed at the substrate surface and during subsequent purging the precursor is removed from the reactor. In the second step, another precursor is introduced on the substrate and the desired films growth reaction takes place. After that reaction, byproducts and the precursor excess are purged from the reactor. When the precursor chemistry is favorable, one ALD cycle can be performed in less than one second in a properly designed flow-type reactor. The most commonly used oxygen source materials for ALD are water, hydrogen peroxide, and ozone. Alcohols, oxygen and nitrous oxide can also been used.

ALD is well suited for deposition of high-k dielectrics such as $AlO_x$, $LaAlO_3$, $HfAlO_3$, $Pr_2O_3$, Lanthanide-doped $TiO_x$, HfSiON, Zr—Sn—Ti—O films using $TiCl_4$ or $TiI_4$, ZrON, $HfO_2$/Hf, $ZrAl_xO_y$, $CrTiO_3$, and $ZrTiO_4$.

The dielectric layers of the present invention can also be formed by evaporation. Dielectric materials formed by evaporation can include: $TiO_2$, $HfO_2$, $CrTiO_3$, $ZrO_2$, $Y_2O_3$, $Gd_2O_3$, $PrO_2$, $ZrO_xN_y$, Y—Si—O, and $LaAlO_3$.

Very thin films of $TiO_2$ can be fabricated with electron-gun evaporation from a high purity $TiO_2$ slug (e.g., 99.9999%) in a vacuum evaporator in the presence of an ion beam. In one embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated $TiO_2$ film. An ion gun with a fairly large diameter (3–4 in. in diameter) is located above the electron gun and argon gas is used to generate Ar ions to bombard the substrate surface uniformly during the film deposition to compact the growing $TiO_2$ film.

A two-step process is used in fabricating a high purity $HfO_2$ film. This method avoids the damage to the silicon surface by Ar ion bombardment, such as that encountered during Hf metal deposition using dc sputtering. A thin Hf film is deposited by simple thermal evaporation. In one embodiment, this is by electron-beam evaporation using a high purity Hf metal slug (e.g., 99.9999%) at a low substrate temperature (e.g., 150°–200° C.). Since there is no plasma and ion bombardment of the substrate (as in the case of sputtering), the original atomically smooth surface of the silicon substrate is maintained. The second step is oxidation to form the desired $HfO_2$.

The first step in the deposition of CoTi alloy film is by thermal evaporation. The second step is the low temperature oxidation of the CoTi film at 400° C. Electron beam deposition of the CoTi layer minimizes the effect of contamination during deposition. The CoTi films prepared from an electron gun possess the highest purity because of the high-purity starting material. The purity of zone-refined starting metals can be as high as 99.999%. Higher purity can be obtained in deposited films because of further purification during evaporation.

A two-step process in fabricating a high-purity $ZrO_2$ film avoids the damage to the silicon surface by Ar ion bombardment. A thin Zr film is deposited by simple thermal evaporation. In one embodiment, this is accomplished by electron beam evaporation using an ultra-high purity Zr metal slug (e.g., 99.9999%) at a low substrate temperature (e.g., 150°–200° C.). Since there is no plasma and ion bombardment of the substrate, the original atomically smooth surface of the silicon substrate is maintained. The second step is the oxidation to form the desired $ZrO_2$.

The fabrication of $Y_2O_3$ and $Gd_2O_3$ films may be accomplished with a two-step process. In one embodiment, an electron gun provides evaporation of high purity (e.g., 99.9999%) Y or Gd metal followed by low-temperature oxidation technology by microwave excitation in a $Kr/O_2$ mixed high-density plasma at 400° C. The method of the present invention avoids damage to the silicon surface by Ar ion bombardment such as that encountered during Y or Gd metal deposition sputtering. A thin film of Y or Gd is deposited by thermal evaporation. In one embodiment, an electron-beam evaporation technique is used with an ultra-high purity Y or Gd metal slug at a low substrate temperature (e.g., 150°–200° C.). Since there is no plasma or ion bombardment of the substrate, the original atomically smooth surface of the silicon substrate is maintained. The second step is the oxidation to form the desired $Y_2O_3$ or $Gd_2O_3$.

The desired high purity of a $PrO_2$ film can be accomplished by depositing a thin film by simple thermal evaporation. In one embodiment, this is accomplished by an electron-beam evaporation technique using an ultra-high purity Pr metal slug at a low substrate temperature (e.g., 150°–200° C.). Since there is no plasma and ion bombardment of the substrate, the original atomically smooth surface of the silicon substrate is maintained. The second step includes the oxidation to form the desired $PrO_2$.

The nitridation of the $ZrO_2$ samples comes after the low-temperature oxygen radical generated in high-density Krypton plasma. The next step is the nitridation of the samples at temperatures >700° C. in a rapid thermal annealing setup. Typical heating time of several minutes may be necessary, depending on the sample geometry.

The formation of a Y—Si—O film may be accomplished in one step by co-evaporation of the metal (Y) and silicon dioxide ($SiO_2$) without consuming the substrate Si. Under a suitable substrate and two-source arrangement, yttrium is evaporated from one source, and $SiO_2$ is from another source. A small oxygen leak may help reduce the oxygen deficiency in the film. The evaporation pressure ratio rates can be adjusted easily to adjust the Y—Si—O ratio.

The prior art fabrication of lanthanum aluminate ($LaAlO_3$) films has been achieved by evaporating single crystal pellets on Si substrates in a vacuum using an electron-beam gun. The evaporation technique of the present invention uses a less expensive form of dry pellets of $Al_2O_3$ and $La_2O_3$ using two electron guns with two rate monitors. Each of the two rate monitors is set to control the composition. The composition of the film, however, can be shifted toward the $Al_2O_3$ or $La_2O_3$ side depending upon the choice of dielectric constant. After deposition, the wafer is annealed ex situ in an electric furnace at 700° C. for ten minutes in $N_2$ ambience. In an alternate embodiment, the wafer is annealed at 800°–900° C. in RTA for ten to fifteen seconds in $N_2$ ambience.

The above described ALD and evaporation techniques are for purposes of illustration only. The embodiments of the present invention are not limited to any one dielectric material or dielectric fabrication technique.

FIG. 4 illustrates the cross-sectional view along axis B–B' of FIG. 2. This view shows that the polysilicon wordline 401 steps down into the trenches for the upper plane cells. The wordline is therefore used to shield the floating gates 403 and 404 of cells along the same wordline and in the same plane. This view is perpendicular to the view of FIG. 3 and thus shows the cells that are adjacent in a substantially perpendicular direction of the memory array matrix.

FIG. 5 illustrates the cross-sectional view along axis C–C' of FIG. 2. This view shows the metal shield layer 351 of FIG. 3. The wordline 501 shields the floating gates 503 and 504 of adjacent cells that are formed in the trenches of FIG. 3. The shielding is accomplished by forming the wordline 501 down into the trenches 900 between columns. The trenches 900 shown in this view are perpendicular to the trenches of FIG. 3 and are discussed subsequently with respect to FIG. 9.

Figure 6:
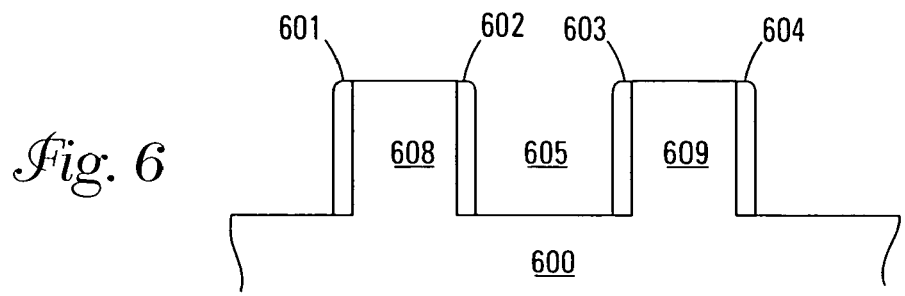
FIG. 6 shows a cross-sectional view of fabrication steps for one embodiment of the present invention in accordance with the array of FIG. 3.

FIG. 6 illustrates an embodiment for fabricating the non-planar flash memory array of FIG. 2. The substrate 600 is etched to produce trenches 605 between the substrate pillars 608 and 609. A doped oxide is deposited over the trenches 605 and pillars 608 and 609. This oxide layer is directionally etched to leave the oxide only on the sidewalls 601–604 of the trenches. During a subsequent anneal process, the source/drain regions of the cells are formed. The sidewall 601–604 oxide layers are then removed and followed by a gate oxidation and/or deposition of a gate insulator.

Figure 7:
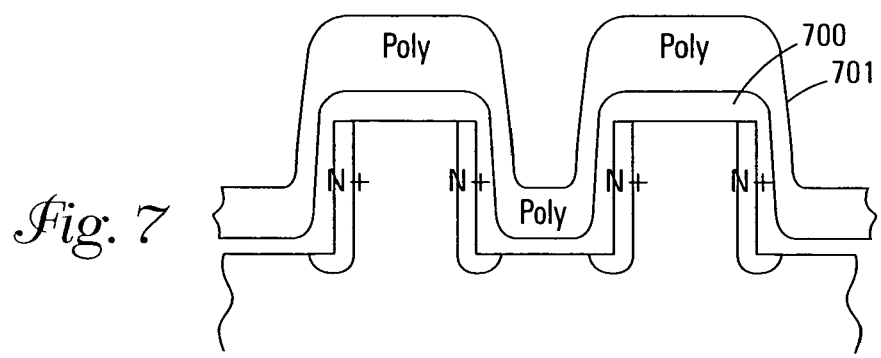
FIG. 7 shows a cross-sectional view of additional steps for one embodiment of the fabrication method of the present invention in accordance with the array of FIG. 2.
Figure 8:
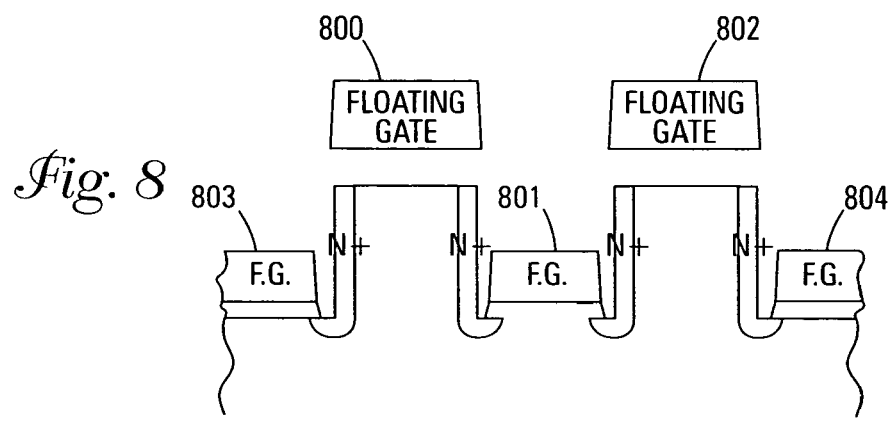
FIG. 8 shows a cross-sectional view of additional steps for one embodiment of the fabrication method of the present invention in accordance with the array of FIG. 2.

FIG. 7 illustrates that a polysilicon layer 701 is directionally deposited over the gate insulator 700. FIG. 8 illustrates that the polysilicon layer 800 is isotropically etched to create the floating gates 800–804.

Figure 9:
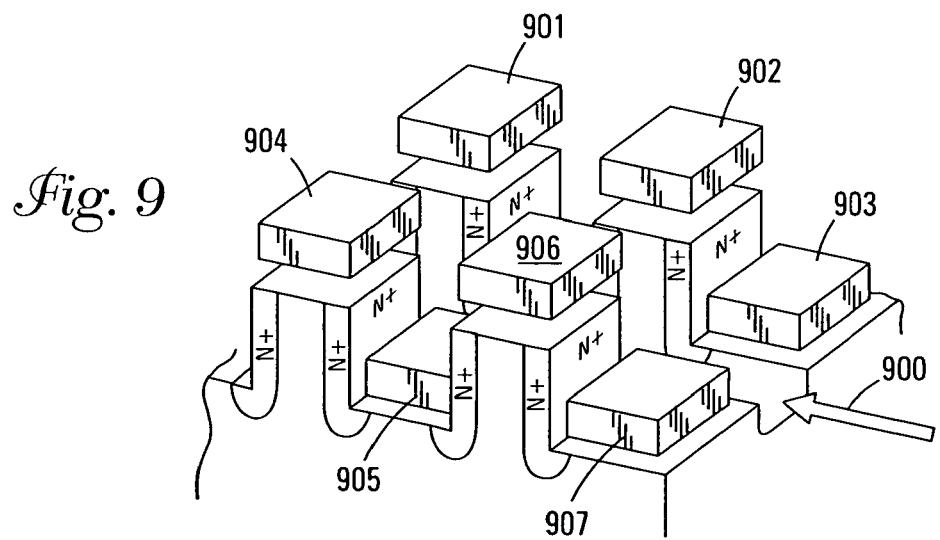
FIG. 9 shows a cross-sectional view of additional steps for one embodiment of the fabrication method of the present invention in accordance with the array of FIG. 2.

As is illustrated in FIG. 9, the structures are masked and trenches etched perpendicular 900 to the original trenches. This separates the floating gate structures 901–907 from the sidewalls and forms pillars with source/drain regions along two of the sidewalls. The second set of trenches is etched deeper into the substrate than the first set (i.e., 605 of FIG. 6) to affect a separation of the source/drain regions along the subsequent control gate or wordline.

The complete structure is filled with a deposited oxide and planarized by chemical mechanical polishing (CMP). The structure is masked and trenches opened up along the original directions exposing the separated floating gates at the bottom of these trenches. The polysilicon floating gates are oxidized or an intergate insulator is deposited and the polysilicon control gates and wordlines are deposited and separated by a short isotropic etch process.

The wordlines are oxidized or covered with a deposited insulator layer and the metal shield layers are deposited and patterned between the wordlines in order to achieve the structure illustrated in FIGS. 2–5. Metallization for contacts can be accomplished using techniques that are well known in the art.

In operation, the stepped, non-planar flash memory devices of the present invention can be programmed with tunnel injection using positive gate voltages with respect to the substrate/p-well. In another embodiment, channel hot electron injection can be used in a programming operation. This is accomplished by applying a positive drain voltage (e.g., +6 to +9V) to a first source/drain region, a positive voltage to the control gate (e.g., +12V) and grounding the second source/drain region to create a hot electron injection into the gate insulator of the charge storage region.

An alternate embodiment programming operation uses substrate enhanced hot electron injection (SEHE). In this embodiment, a negative substrate bias is applied to the p-type substrate. This bias increases the surface lateral field near a source/drain region thus increasing the number of hot electrons. The benefit of such an embodiment is that a lower drain voltage is required during programming operations. In one embodiment, the negative substrate bias is in the range of 0V to −3V. Alternate embodiments may use other voltage ranges.

For an erase operation, one embodiment uses tunneling with conventional negative gate voltages with respect to the substrate/p-well. In another embodiment, the control gate is grounded, the drain connection is left floating and the source region has a positive voltage applied (e.g., +12V). Alternate embodiments for erase operations can use other methods such as substrate enhanced band-to-band tunneling induced hot hole injection (SEBBHH) that are well known in the art.

Figure 10:
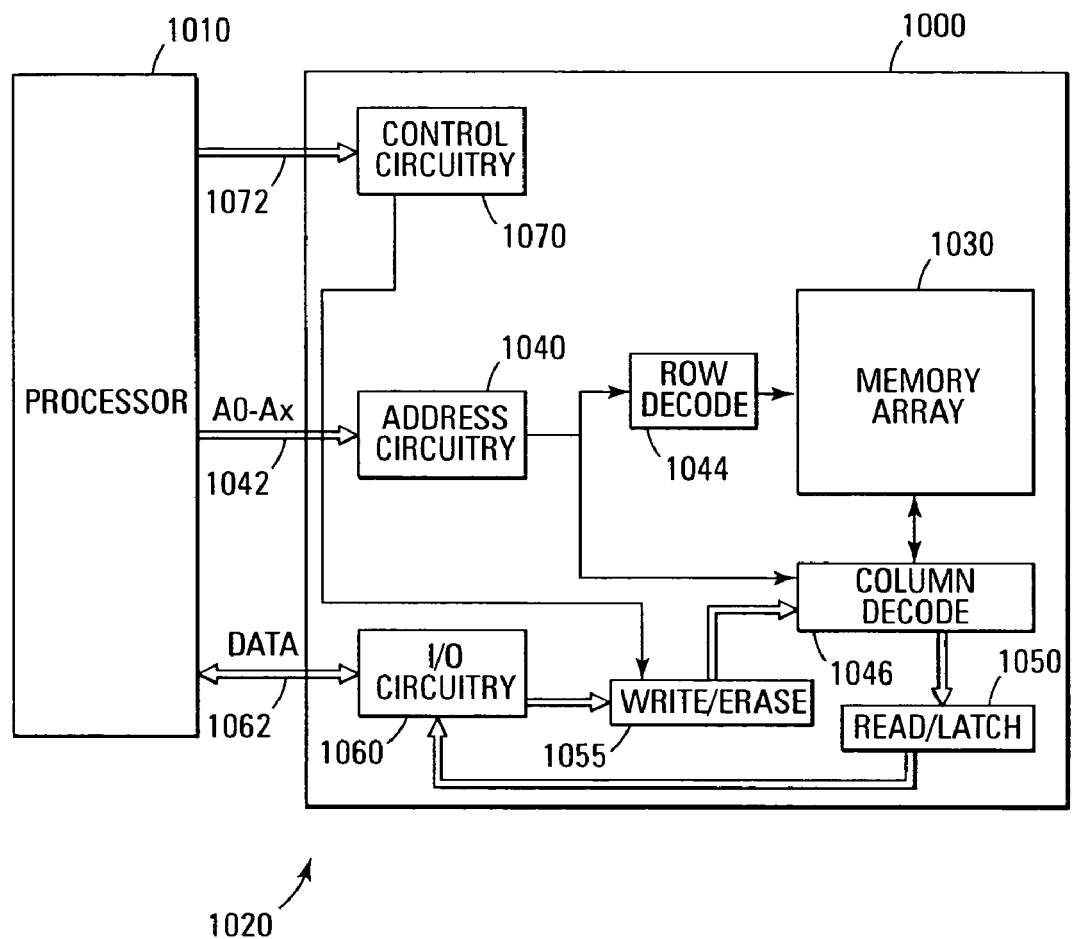
FIG. 10 shows a block diagram of an electronic system of the present invention that incorporates the memory array of FIG. 2.

FIG. 10 illustrates a functional block diagram of a memory device 1000 that can incorporate the flash memory array with shielded floating gates of the present invention. The memory device 1000 is coupled to a processor 1010. The processor 1010 may be a microprocessor or some other type of controlling circuitry. The memory device 1000 and the processor 1010 form part of an electronic system 1020. The memory device 1000 has been simplified to focus on features of the memory that are helpful in understanding the present invention.

The memory device includes an array of flash memory cells 1030 that can be comprised of the stepped, non-planar flash memory cells with shielded floating gates as described previously. The memory array 1030 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 1040 is provided to latch address signals provided on address input connections A0-Ax 1042. Address signals are received and decoded by a row decoder 1044 and a column decoder 1046 to access the memory array 1030. It will be appreciated by those skilled in the art, with the benefit of the present description, that the number of address input connections depends on the density and architecture of the memory array 1030. That is, the number of addresses increases with both increased memory cell counts and increased bank and block counts.

The memory device 1000 reads data in the memory array 1030 by sensing voltage or current changes in the memory array columns using sense/buffer circuitry 1050. The sense/buffer circuitry, in one embodiment, is coupled to read and latch a row of data from the memory array 1030. Data input and output buffer circuitry 1060 is included for bi-directional data communication over a plurality of data connections 1062 with the controller 1010. Write circuitry 1055 is provided to write data to the memory array.

Control circuitry 1070 decodes signals provided on control connections 1072 from the processor 1010. These signals are used to control the operations on the memory array 1030, including data read, data write (program), and erase operations. The control circuitry 1070 may be a state machine, a sequencer, or some other type of controller.

The flash memory device illustrated in FIG. 10 has been simplified to facilitate a basic understanding of the features of the memory. A more detailed understanding of internal circuitry and functions of flash memories are known to those skilled in the art.

CONCLUSION

In summary, the flash memory array of the present invention utilizes stepped, non-planar memory cells that have shielded floating gates to reduce coupling capacitance between cells while increasing memory density. Neighboring floating gates in an upper plane of the array are shielded by a metal layer in one direction and by a wordline in a substantially perpendicular direction. Neighboring floating gates in a lower plane of the array are shielded by silicon pillars in one direction and a wordline in a substantially perpendicular direction. The non-planar configuration provides a density, in one embodiment, of $2F^2$/bit versus the typical $4F^2$/bit of the prior art conventional NAND flash memory structure.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-planar flash memory array with shielded memory cells each comprising a floating gate and a control gate coupled to a wordline in a row of a plurality of rows, the array comprising:
   a first plurality of memory cells in a first plane in a first column of memory cells of a plurality of columns, adjacent columns being separated by a substantially parallel trench without memory cells and each column substantially perpendicular to each row wherein each wordline is formed such that it is depressed into at least a portion of each trench to shield floating gates of adjacent memory cells in the same plane and the same row; and
   a metal layer formed between adjacent memory cells in the first plane in the first column of memory cells such that the floating gates of the adjacent memory cells are shielded from each other.

2. The array of claim 1 and further including a second plurality of memory cells in a second plane in the first column, the second plurality of memory cells coupled to the first plurality of memory cells wherein the metal layer is formed over the second plane of the second plurality of memory cells.

3. The array of claim 2 wherein the first plurality of memory cells is coupled to the second plurality of memory cells through source/drain regions of adjacent memory cells.

4. The array of claim 3 wherein a first source/drain region couples a memory cell in the first plane with an adjacent memory cell in the first column and in the second plane.

5. The array of claim 2 wherein the first and second plurality of memory cells are coupled together in a NAND architecture.

6. The array of claim 2 wherein the first plurality of memory cells is fabricated on substrate pillars and the second plurality of memory cells is fabricated in trenches formed between the pillars.

7. The array of claim 3 wherein the source/drain regions are n+ doped regions in a p-type substrate.

8. The array of claim 1 wherein a density of the memory array is $2F^2$/bit.

9. A flash memory array comprising:
   a plurality of flash memory cells each comprising a floating gate and arranged in a matrix of rows and columns on a substrate, each row of memory cells coupled by a wordline on a first of a plurality of planes;
   a plurality of trenches, each trench formed substantially parallel to and between adjacent columns and not having any memory cells formed therein, wherein each wordline is depressed into each trench to a depth required to shield the floating gates of adjacent memory cells in the same wordline; and
   a shield material formed between adjacent rows of memory cells on the first plane such that the floating gates of memory cells in the adjacent rows are shielded.

10. The array of claim 9 wherein each column of memory cells is coupled in series, source to drain, through doped source/drain regions between adjacent memory cells on the first and a second plane and adjacent rows of memory cells on the second plane are shielded by pillars of silicon in the substrate.

11. The array of claim 10 wherein the source/drain regions are doped into sidewalls of the pillars.

12. The array of claim 10 wherein the first plane of memory cells is fabricated on the pillars and the second plane of memory cells is fabricated in trenches adjacent to the pillars.

13. The array of claim 9 wherein the array is coupled in a NOR architecture.

14. The array of claim 9 wherein the array is coupled in a NAND architecture.

15. A flash memory device comprising:
   a plurality of columns of memory cells, the memory cells of each column fabricated in multiple planes of a substrate;
   a plurality of trenches substantially parallel to and separating adjacent columns and not containing memory cells therein;
   a plurality of rows of memory cells, each row of memory cells fabricated in one of the multiple planes, each row coupled by a different wordline that is depressed into a trench to a depth necessary to shield adjacent memory cells in the same row; and
   a metal layer formed over each row in a first plane and between each row in a second plane of the multiple planes.

16. The device of claim 15 wherein the memory cells of the first plane of the multiple planes are fabricated in trenches of the substrate.

17. The device of claim 15 wherein the memory cells of the second plane of the multiple planes are fabricated on pillars of the substrate formed by the trenches wherein the pillars shield the adjacent rows of memory cells on the first plane.

18. The device of claim 15 wherein the memory cells of each of the plurality of columns are coupled in series through n+ source/drain regions that are doped into sidewalls of the pillars.

19. The device of claim 15 wherein source/drain regions are located in sidewalls of each trench such that a memory cell in the first plane is coupled to an adjacent memory cell in the second plane.

20. The device of claim 15 wherein each memory cell is comprised of a floating gate separated from the substrate by a gate insulator and a control gate separated from the floating gate by an intergate insulator, the gate insulator and the intergate insulator comprised of high-k dielectric materials that have a dielectric constant greater than that of $SiO_2$.

21. An electronic system comprising:
   a processor that generates memory control signals; and
   a non-planar, flash memory array comprising memory cells, having shielded floating gates, coupled to the processor that operates in response to the memory control signals, the array comprising:
      a first plurality of memory cells in a first plane in a first column of memory cells of a plurality of columns of memory cells, adjacent columns separated by a substantially parallel trench that does not have memory cells formed therein;
      a plurality of wordlines for coupling rows of memory cells and substantially perpendicular to the columns of memory cells, each wordline formed in a depressed fashion in each trench such that adjacent memory cells in the same row are shielded from each other; and
      a metal layer formed between adjacent memory cells in the first plane in the first column of memory cells such that the floating gates of the adjacent memory cells in a column are shielded from each other.

* * * * *